United States Patent
Whiston et al.

(10) Patent No.: US 6,835,627 B1
(45) Date of Patent: Dec. 28, 2004

(54) METHOD FOR FORMING A DMOS DEVICE AND A DMOS DEVICE

(75) Inventors: Seamus Paul Whiston, Limerick (IE); Andrew David Bain, Limerick (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/480,223

(22) Filed: Jan. 10, 2000

(51) Int. Cl.$^7$ .............................................. H01L 21/336
(52) U.S. Cl. ...................................................... 438/302
(58) Field of Search .................................. 438/276, 275, 438/288, 289–291, 301–307, 514, 517–519, 525–527, 531; 257/335, 368, 378

(56) References Cited

U.S. PATENT DOCUMENTS

| | | | | |
|---|---|---|---|---|
| 4,931,408 A | * | 6/1990 | Hshieh | 437/44 |
| 5,409,848 A | * | 4/1995 | Han et al. | 437/35 |
| 6,426,258 B1 | * | 7/2002 | Harada et al. | 438/268 |

OTHER PUBLICATIONS

Ohzone et al., "Electrical Characteristics of Scaled CMOS-FET's with Source/Drain Regions Fabricated by 7 degrees and O degrees Tilt–Angle Implantations", IEEE, vol., 42, No. 1, pp. 70–77, Jan./1995.*

Contiero, C. et al, "LDMOS implementation by large tilt implant in 0.6μm BCD5 process, flash memory compatible", IEEE, 1996, pp. 75–78.

* cited by examiner

*Primary Examiner*—Craig A. Thompson
(74) *Attorney, Agent, or Firm*—Wolf, Greenfield & Sacks P.C.

(57) ABSTRACT

A method for forming an LDNMOS (1) and LDPMOS (2) in a CMOS process comprises forming the LDNMOS (1) and LDPMOS (2) to a stage where a gate (14) is laid down on a gate oxide layer (12) and a locos (9) is formed over the respective N and P-wells (4) and (5) of the LDNMOS (1) and LDPMOS (2). A P-body (15) is formed in the N-well (4) of the LDNMOS (1) by implanting a boron dopant in two stages, in the first stage at a first tilt angle (θ) of 45° for forming the P-body (15) beneath the gate (14) for determining the source/drain threshold voltage, and subsequently at a second tilt angle (φ) of 7° for extending the P-body (15) downwardly at (25) for determining the punchthrough breakdown voltage of the LDNMOS (1). The formation of an N-body (16) in a P-well (5) of the LDPMOS (2) is similar to the formation of the P-body (15) with the exception that the dopant is a phosphorous dopant.

15 Claims, 4 Drawing Sheets

METHOD FOR FORMING A DMOS DEVICE AND A DMOS DEVICE

FIELD OF THE INVENTION

The present invention relates to a method for forming a DMOS device, and in particular, to a method for forming a body region in a drain region of the DMOS device appropriately aligned in the DMOS device. The invention also relates to a DMOS device.

BACKGROUND TO THE INVENTION

Power integrated circuits in many cases require a combination of lateral DMOS (LDMOS) devices and CMOS devices as well as bipolar CMOS (SiCMOS) devices on the same chip. Indeed, there are many other types of integrated circuits where it is desirable to provide a combination of DMOS and CMOS and/or BiCMOS devices on the same chip. From here on the term "CMOS process" is intended to cover both CMOS and BiCMOS processes. However, known processes for forming DMOS devices are different to known processes for forming CMOS devices, and thus, in general, where it is desired to produce a wafer comprising chips having combinations of DMOS and CMOS devices, the wafer must be subjected to both CMOS and DMOS forming processes. This adds considerably to both the production time and cost of producing such chips with combinations of CMOS and DMOS devices. In the manufacture of DMOS devices, and in particular, LDMOS devices it is essential that a body region which is to be formed in the drain region of the LDMOS device should extend partly beneath the gate of the device, and furthermore, should appropriately aligned with the gate of LDMOS device, In a paper entitled "LDMOS Implementation by Large Tilt Implant in 0.6 μm BCD5 Process. Flash Memory Compatible" read at the International Symposium of Power Semiconductor Devices, May 1996, and published with the proceedings of the Symposium, Contiero, et al of SGS-Thompson Microelectronics disclose a method for integrating a self-aligned lateral DNMOS (LDNMOS) device into a bipolar CMOS, DMOS process. In this process the LDNMOS device is fabricated up to and including the gate using a CMOS process. The P-body region is then formed beneath the gate by implanting an appropriate dopant into the drain region at an angle to the surface of the drain region using an edge of the gate to form part of the mask on the drain region which defines the area of the surface of the drain region through which the dopant is to be implanted. The dopant is directed in a direction towards the drain region and the edge of the gate for implanting the dopant partly under the gate. In other words, the dopant is implanted using a single large angle of tilt from a perpendicular axis extending from the general plane of a wafer on which the device is being formed. Subsequent to implanting the dopant is diffused into a portion of the drain region for forming the P-body using a suitable CMOS diffusion process. Contiero, et al disclose three possible tilt angles, namely, 30°, 40° and 60°, from which the single tilt angle may be selected. A 45° dopant implant tilt angle appears from the paper of Contiero, et al to be the optimum.

While in the method of Contiero, et al the P-body extends beneath the gate, and is appropriately aligned therewith, the LDNMOS of Contiero, et al suffers from a number of disadvantages. In particular, it is difficult using the method of Contiero, et al to determine the breakdown voltage from source to drain in a lateral or a vertical direction due to punchthrough independently of the drain/source threshold voltage in the LDMOS for a particular well doping concentration, and vice versa. In order to achieve a desirably low drain/source threshold voltage the dose and energy level of the dopant required are such as to result in a relatively low punchthrough breakdown voltage, while on the other hand if the dopant dosage and energy level is set to achieve a relatively high punchthrough breakdown voltage the drain/source threshold voltage is undesirably high. Similarly it is difficult using the method of Contiero, et al to determine the avalanche breakdown voltage independently of the drain/source threshold voltage in the LDMOS. Thus, while the method proposed by Contiero, et al provides for the forming of an LDNMOS device using a CMOS process, the LDNMOS device, in general, is unsuitable for most applications.

There is therefore a need for a method for producing a DMOS device which overcomes these problems, and in particular, a method for forming such a DMOS device using a CMOS process.

The present invention is directed towards providing such a method and a DMOS device.

SUMMARY OF THE INVENTION

According to the invention there is provided a method for forming a body region in a drain region of a DMOS device on a wafer after the gate has been formed with the body region extending partly beneath a gate of the DMOS device and appropriately aligned with the gate, the drain region defining a surface plane, the method comprising the steps of:

(a) implanting a suitable dopant in a portion of the drain region adjacent the gate for forming the body region to have a desired drain/source threshold voltage, and (b) implanting a suitable dopant in the said portion of the drain region adjacent the gate for forming the body region to have a desired breakdown voltage through the drain region, steps (a) and (b) being performed in any order, and the dopant being implanted in step (a) by directing the dopant at a first angle to the surface plane of the drain region for directing at least some of the dopant beneath the gate, the first angle to the surface plane at which the dopant is directed in step (a) being less than a second angle to the surface plane at which the dopant is directed in step (b).

Preferably, the dopant is directed at the first angle towards the surface plane in step (a) in a general source/drain direction. Advantageously, the dopant is directed at the second angle towards the surface plane in step (b) in a general source/drain direction.

In one embodiment of the invention the first angle to the surface plane of the drain region at which the dopant is directed in step (a) lies in the range of 30° to 60°. Preferably, the first angle to the surface plane of the drain region at which the dopant is directed in step (a) lies in the range of 40° to 50°. Advantageously, the first angle to the surface plane of the drain region at which the dopant is directed in step (a) is approximately 45°.

In another embodiment of the invention the second angle to the surface plane of the drain region at which the dopant is directed in step (b) lies in the range of 70° to 90°. Preferably, the second angle to the surface plane of the drain region at which the dopant is directed in step (b) lies in the range of 78° to 88°. Advantageously, the second angle to the surface plane of the drain region at which the dopant is directed in step (b) is approximately 83°.

In one embodiment of the invention the dopant is implanted in the drain region in each of steps (a) and (b)

using an edge of the gate adjacent the source as part of a mask for defining a portion of the surface of the drain region through which the dopant is to be implanted. The dopant implanted in each of steps (a) and (b) may be the same or different, and the dopant implanted in each of steps (a) and (b) may be implanted at the same or different dose and/or energy levels.

In one embodiment of the invention the dopant implanted in the drain region in each of steps (a) and (b) is diffused by a dopant diffusion process for forming the body region. Alternatively, the dopant implanted in the drain region in each of the steps (a) and (b) is diffused in the drain region before the dopant of the next of the steps (a) and (b) is implanted.

In one embodiment of the invention step (a) is carried out before step (b).

In another embodiment of the invention the drain region is formed by an N-well, and the body region is formed as a P-body, and the dopant of each of steps (a) and (b) is boron.

In a further embodiment of the invention the drain region is formed by a P-well, and the body region is an N-body, and the dopant of each of steps (a) and (b) is phosphorous.

Ideally, the dose and energy levels of the dopant implanted in each of steps (a) and (b) are sufficient for providing the desired drain/source threshold voltage and the breakdown voltage through the drain region.

In one embodiment of the invention the breakdown voltage exceeds the drain/source threshold voltage.

In one embodiment of the invention the method for forming the body region in the drain region of the DMOS device is a CMOS process, and in general, a CMOS device is formed on the wafer by the CMOS process. In another embodiment of the invention the method for forming the body region in the drain region of the DMOS device is a BiCMOS process, and in general, a BiCMOS device is formed on the wafer by the BiCMOS process.

In one embodiment of the invention the DMOS device is an LDMOS device, and may be an LDPMOS and/or an LDNMOS. Additionally, the DMOS may be a vertical DMOS.

Additionally, the invention provides a DMOS device comprising a drain region defining a surface plane, a gate located on the drain region, and a body region formed in the drain region and extending partly beneath the gate and appropriately aligned therewith, the body region being formed after the gate region has been formed by:

(a) implanting a suitable dopant in a portion of the drain region adjacent the gate for forming the body region to have a desired drain/source threshold voltage, and (b) implanting a suitable dopant in the said portion of the drain region adjacent the gate for forming the body region to have a desired breakdown voltage through the drain region, steps (a) and (b) being performed in any order, and the dopant being implanted in step (a) by directing the dopant at a first angle to the surface plane of the drain region for directing at least some of the dopant beneath the gate, the first angle to the surface plane at which the dopant is directed in step (a) being less than a second angle to the surface plane at which the dopant is directed in step (b).

In one embodiment of the Invention the DMOS device is an LDMOS device, and may be an LDNMOS device or a LDPMOS device. Additionally, the DMOS may be a vertical DMOS.

Further the invention provides an integrated circuit chip comprising a DMOS device according to the invention, and the integrated circuit chip may also comprise a CMOS device or a BiCMOS device.

ADVANTAGES OF THE INVENTION

The advantages of the invention are many. A particularly important advantage of the invention is that it permits LDNMOS and LDPMOS devices to be formed using a conventional CMOS or SiCMOS process, and thus, LDNMOS and LDPMOS devices may be formed simultaneously with the formation of CMOS and/or BiCMOS devices. In particular, by adapting the CMOS process according to the invention the drain/source threshold voltage of the respective LDNMOS and LDPMOS devices can be determined independently of the punchthrough breakdown voltage of the devices, and indeed, independently of the avalanche breakdown voltage. The method according to the invention may be used for forming vertical DMOS devices with similar advantages. Thus, the invention overcomes the problems of forming LDNMOS and LDPMOS devices using CMOS processes known heretofore.

The invention will be more clearly understood from the following description of a preferred embodiment thereof which is given by way of example only with reference to the accompanying drawings.

DETAILED DESCRIPTION OF THE INVENTION

Figure 1:
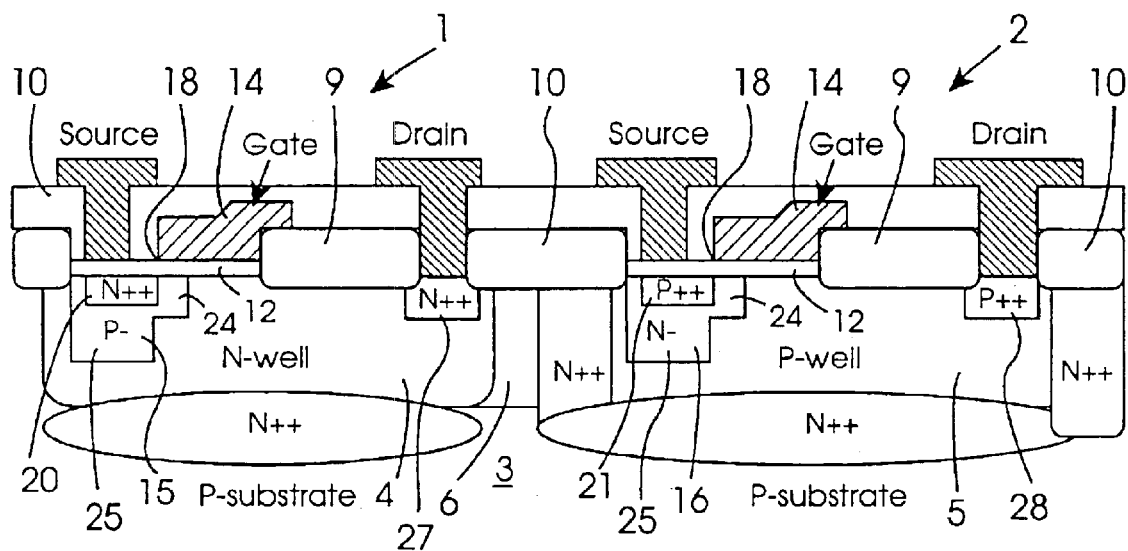
FIG. 1 is a transverse cross-sectional elevational view of an LDNMOS and an LDPMOS according to the invention formed on a silicon substrate by a CMOS process using a method according to the invention.

Referring to the drawings there is illustrated an LDNMOS indicated generally by the reference numeral 1 and an LDPMOS indicated generally by the reference numeral 2 both according to the invention, and both formed on a silicon substrate, in this embodiment of the invention a P-substrate 3 by a CMOS process using a method according to the invention. An N-well 4 for the LDNMOS 1 and a. P-well 5 for the LDPMOS 2 are formed in an epitaxial layer 6 using a conventional CMOS process which will be well known to those skilled in the art. An oxide layer for forming a locos 9 of each LDNMOS 1 and LDPMOS 2 is laid down over the N-well 4 and the P-well 5 and appropriately etched to form the respective locos 9. The oxide layer which forms the locos 9, also forms a mask 10 for defining respective areas through which dopants are implanted in the N-well 4 and P-well 5 for forming a P-body region 15, and an N-body region 16, respectively in the respective N-well 4 and P-well 5 as will be described below. A gate oxide layer 12 of approximately 12 nm is laid down on the respective N and P-wells 4 and 5, and respective gates 14 of the LDNMOS 1 and the LDPMOS 2 are formed over a part of the gate oxide layer 12 and over a part of the locos 9. Up to here the formation of the LDNMOS 1 and LDPMOS 2 is carried out using a conventional CMOS process.

The P-body and N-body regions 15 and 16, respectively, are next formed in the N-well 4 and the P-well 5, respectively, beneath the gates 14 by Implanting appropriate dopants using the method according to the invention, which will now be described. The mask 10 forms three sides of respective areas of the gate oxide layers 12 and in turn the surface of the N-well 4 and the P-well 5 through which the dopants are to be implanted into the N-well 4 and the P-well 5 to form the P-body and the N-body regions 15 and 16, respectively. An edge 18 of the corresponding gate 14 forms the fourth side of each mask The edge 18 is that edge of the gate 14 which is adjacent corresponding source contact regions 20 and 21 of the respective LDNMOS 1 and LDPMOS 2 which are subsequently formed.

Figure 8A:
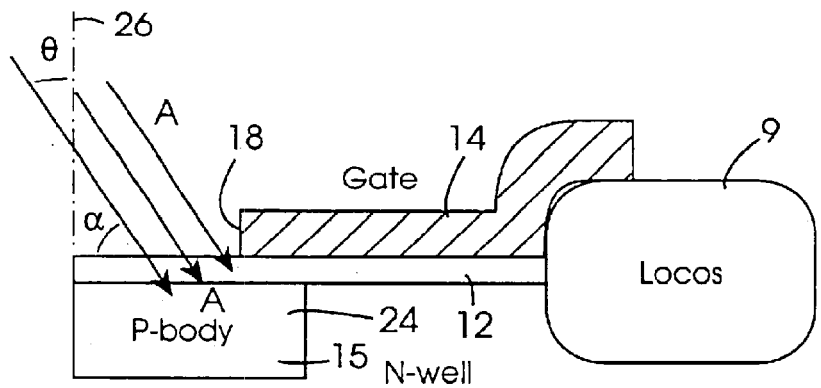
Figure 8B:
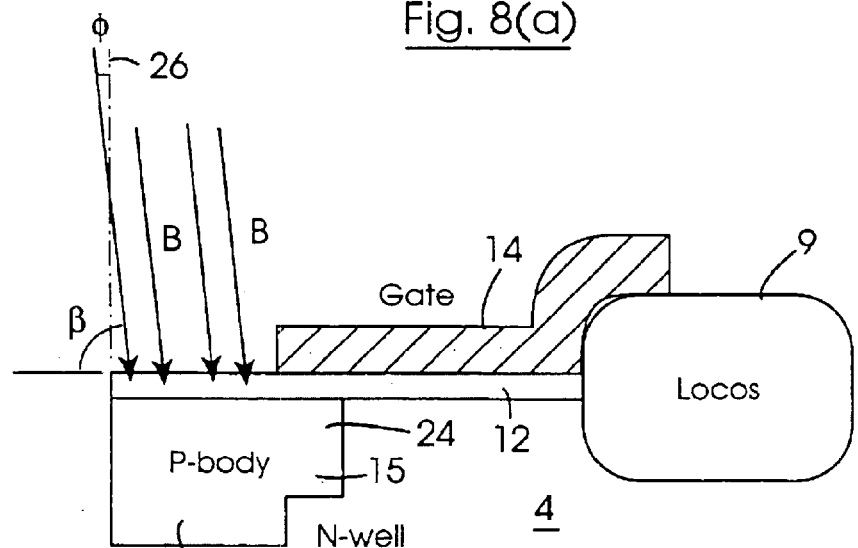
Figure 2:
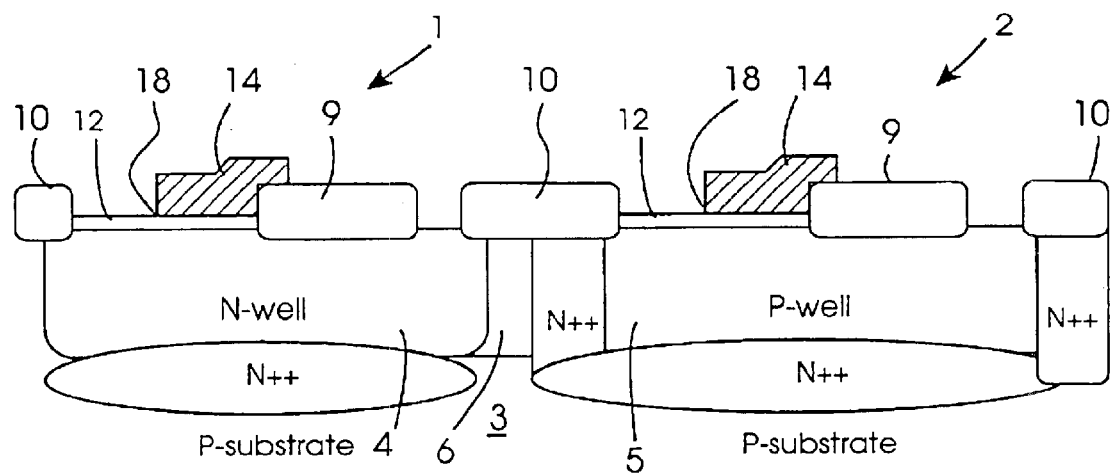
FIG. 2 is a transverse cross-sectional elevational view of the LDNMOS and the LDPMOS of FIG. 1 in the process of being formed.
Figure 3:
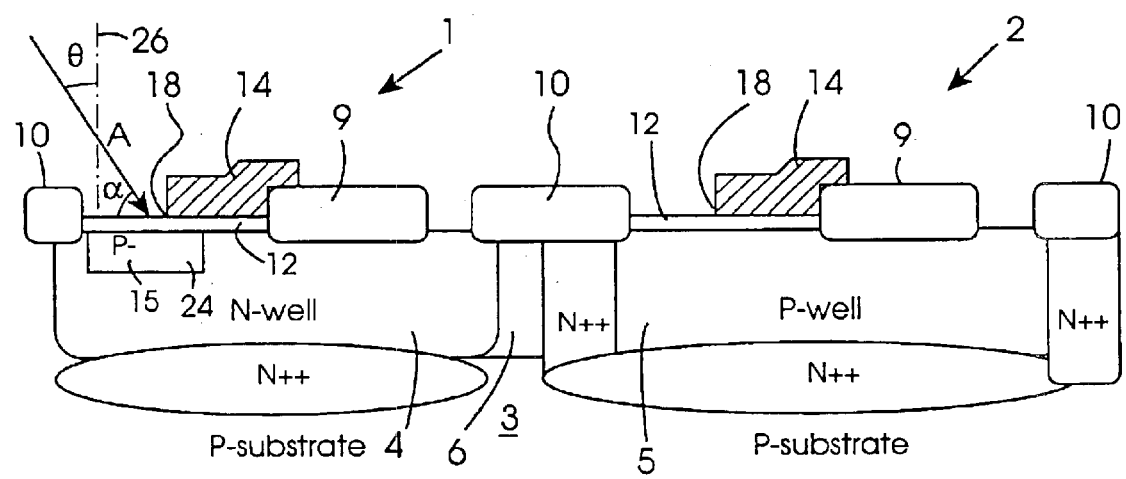
FIG. 3 is a view similar to FIG. 2 of the LDNMOS and the LDPMOS at the next stage of their formation after that of FIG. 2.
Figure 4:
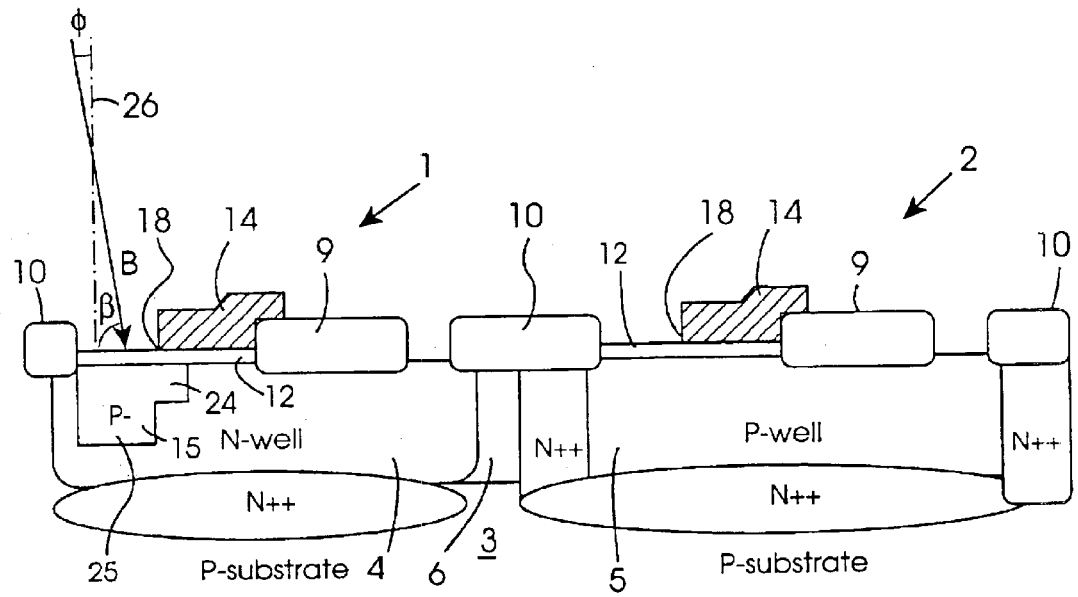
FIG. 4 is a view similar to FIG. 2 of the LDNMOS and the LDPMOS at the next stage of their formation after that of FIG. 3.
Figure 5:
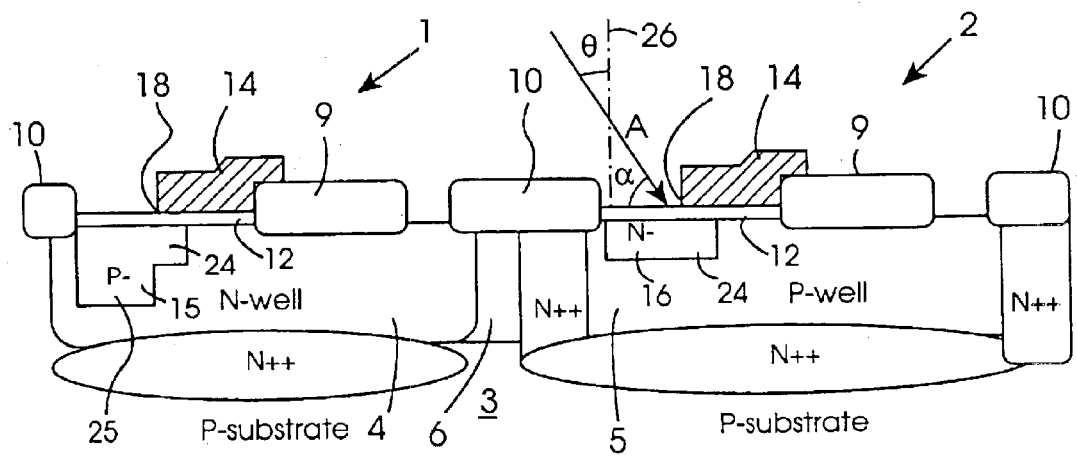
FIG. 5 is a view similar to FIG. 2 of the LDNMOS and the LDPMOS at the next stage of their formation after that of FIG. 4.
Figure 6:
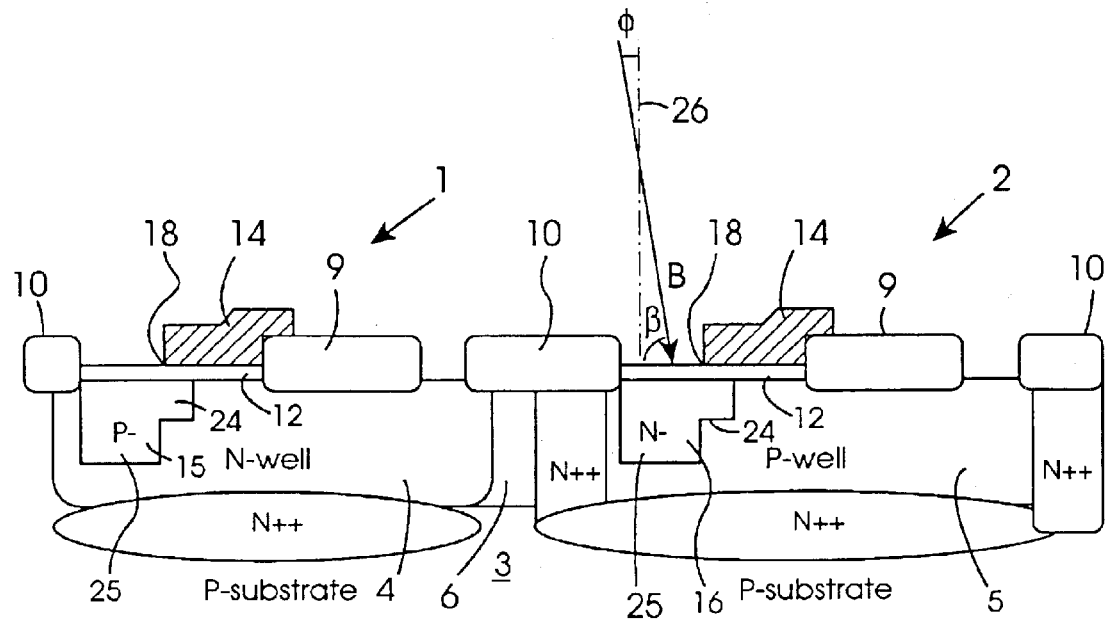
FIG. 6 is a view similar to FIG. 2 of the LDNMOS and the LDPMOS at the next stage of their formation after that of FIG. 5.
Figure 7:
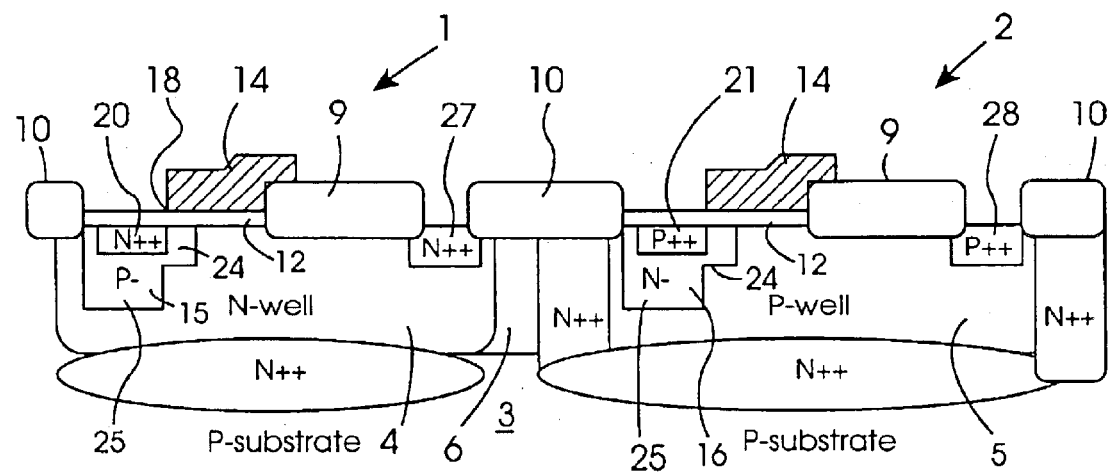
FIG. 7 is a view similar to FIG. 2 of the LDNMOS and the LDPMOS at the next stage of their formation after that of FIG. 6, and FIGS. 8(*a*) and (*b*) are transverse cross-sectional elevational views of a detail of the LDNMOS and the LDPMOS at two stages of their formation.

The P-body 15 is formed by implanting the dopant, namely, boron in the N-well 4 in two steps. In the first step the dopant is directed Into the N-well 4 in the direction of the arrows A, see FIG. 8($a$), at a first angle $\alpha$ to the surface of the gate oxide layer 12 for forming a portion 24 of the P-body 15 beneath the gate 14 and for determining the drain/source threshold voltage, see also FIG. 3. In the second step the dopant is directed at the N-well in the direction of the arrows B, see FIG. 8($b$), at a second angle $\beta$ for extending the P-body 15 downwardly at 25 for determining the breakdown voltage due to punchthrough through the P-body 15, see also FIG. 4. In this embodiment of the invention the first angle $\alpha$ is 45° and the second angle $\beta$ is 83°. This is achieved by selecting the tilt angle at which the dopant is directed towards the surface of the gate oxide layer 12 in the CMOS process. The tilt angle is measured relative to an axis 26 extending perpendicularly to the general plane defined by the wafer. The dopant is directed at the first angle $\alpha$ by setting the tilt angle of implant at a first tilt angle $\beta$ of 45° from the perpendicular axis 26. The dopant is implanted at the second angle $\theta$ by setting the tilt angle of implant at a second tilt angle $\phi$ of 7° from the perpendicular axis 26. The direction at which the dopant is implanted at the first and second tilt angles $\theta$ and $\phi$ is selected so that the dopant is directed towards the surface of the gate oxide layer 12 and towards the edge 18 of the gate 14 in a general source/drain direction.

The dose level of dopant implanted at the first and second tilt angles $\theta$ and $\phi$ may be similar or different, and the energy at which the dopant is implanted at the first and second tilt angles $\theta$ and $\phi$ may also be similar or different. The dose and energy at which the dopant is implanted at the first tilt angle $\theta$ is determined by the desired drain/source threshold voltage of the LDNMOS 1, and the dose and energy at which the dopant is implanted at the second tilt angle $\phi$ is determined by the desired breakdown voltage of the P-body 15. The selection of the appropriate dose and energy levels at which the dopant is to be implanted at the first and second tilt angles $\theta$ and $\phi$ will be known to those skilled in the art.

After the dopant has been implanted to form the P-body 15 the N-body 16 is then formed in the P-well 5 of the LDPMOS 2. The N-body 16 is formed in the P-well 5 of the LDPMOS 2 using a similar method as is used for forming the P-body 15, with the exception that the dopant is phosphorous. The phosphorous dopant is initially implanted in the P-well 5 at the first angle $\alpha$ of 45° using the first tilt angle $\delta$ of 45° for determining the drain/source threshold voltage of the LDPMOS 2. The phosphorous dopant is then implanted in the P-well 5 at the second angle $\theta$ of 83° using the second tilt angle $\phi$ of 7° for determining the breakdown voltage of the N-body 16. As in the case of implanting the boron dopant in the N-well 4 for forming the P-body 15, the dose of phosphorous dopant and the energy with which the phosphorous dopant is implanted at the respective first and second tilt angles $\theta$ and $\phi$ may be similar or different, and will be determined by the desired drain/source threshold voltage and the desired punchthrough breakdown voltage of the LDPMOS 2.

After the boron and phosphorous dopants have been implanted in the N-well 4 and the P-well 5, respectively, at the first and second tilt angles $\theta$ and $\phi$ the dopants are simultaneously diffused using a conventional CMOS polycide anneal step.

The N++ source contact region 20 and an N++ drain contact region 27 are next formed in the P-body 15 and in the N-well 4, respectively, by implanting dopants Nldd and NSD into the P-body 15 through the gate oxide layer 12, and directly into the N-well 4 by the CMOS process. The P++ source contact region 21 and a P++ drain contact region 28 are formed in the N-body 16 and the P-well 5, respectively, by implanting dopants Pldd and PSD in the N-body 16 and the P-well 5, respectively. After the Nldd dopants and the Pldd dopants have been implanted the wafer is subjected to a CMOS thermal cycle for driving the dopants into the respective P and N-bodys 15 and 16 and the N and P-wells 4 and 5. The NSD and PSD implants are subsequently driven in by a further CMOS thermal cycle. The formation of N++ and P++ regions will be well known to those skilled in the art.

Thereafter, the process for forming the LDNMOS 1 and the LDPMOS 2 continues using the conventional CMOS process, and the remaining process steps will thus be well known to those skilled in the art.

Although described for forming LDMOS devices, the method according to the invention may also be used for forming vertical DMOS devices. It will of course be appreciated that although not described, CMOS devices may also be formed on the wafer either simultaneously or sequentially with the formation of the LDMOS devices. While the LOMOS devices have been described as being formed using a CMOS process, it will of course be appreciated that the LDMOS devices may be formed using a BiCMOS process, in which case, bipolar CMOS devices may also be formed simultaneously or sequentially with the DMOS devices.

While in the embodiment of the invention described the p-body region has been described as being implanted before the n-body region, it will be appreciated that the p-body and n-body regions may be formed in any order.

What is claimed is:

1. A method for forming a body region in a drain region of a DMOS device on a wafer after a gate has been formed with the body region extending partly beneath the gate of the DMOS device and appropriately aligned with the gate, the drain region defining a surface plane, the method comprising the steps of:

(a) implanting a suitable dopant in a portion of the drain region adjacent the gate for forming the body region to have a desired drain/source threshold voltage, and (b) implanting a suitable dopant in the said portion of the drain region adjacent the gate for forming the body region to have a desired breakdown voltage through the drain region, steps (a) and (b) being performed in any order, and the dopant being implanted in step (a) by directing the dopant at a first angle to the surface plane of the drain region for directing at least some of the dopant beneath the gate, the first angle to the surface plane at which the dopant is directed in step (a) being less than a second angle to the surface plane at which the dopant is directed in step (b).

2. A method as claimed in claim 1 in which the dopant is directed at the first angle towards the surface plane in step (a) in a general source/drain direction.

3. A method as claimed in claim 1 in which the dopant is directed at the second angle towards the surface plane in step (b) in a general source/drain direction.

4. A method as claimed in claim 1 in which the first angle to the surface plane of the drain region at which the dopant is directed in step (a) lies in the range of 30° to 60°.

5. A method as claimed in claim 4 in which the first angle to the surface plane of the drain region at which the dopant is directed in step (a) is approximately 45°.

6. A method as claimed in claim 1 in which the second angle to the surface plane of the drain region at which the dopant is directed in step (b) lies in the range of 70° to 90°.

7. A method as claimed in claim 6 In which the second angle to the surface plane of the drain region at which the dopant is directed in step (b) is approximately 83°.

8. A method as claimed in claim 1 in which the dopant is implanted in the drain region in each of steps (a) and (b) using an edge of the gate adjacent the source as part of a mask for defining a portion of the surface of the drain region through which the dopant is to be implanted.

9. A method as claimed in claim 1 in which the dopant implanted in each of 7 steps (a) and (b) may be the same or different, and the dopant implanted in each of steps (a) and (b) may be implanted at the same or different dose and/or energy levels.

10. A method as claimed in claim 1 in which the dopant implanted in the drain region in each of steps (a) and (b) is diffused by a dopant diffusion process for forming the body region.

11. A method as claimed in claim 1 in which the drain region is formed by an N-well, and the body region is formed as a P-body, and the dopant of each of steps (a) and (b) is boron.

12. A method as claimed in claim 1 in which the drain region is formed by a P-well, and the body region is an N-body, and the dopant of each of steps (a) and (b) is phosphorous,.

13. A method as claimed in claim 1 in which the dose and energy levels of the dopant implanted in each of steps (a) and (b) are sufficient for providing the desired drain/source threshold voltage and the desired breakdown voltage through the drain region.

14. A method as claimed in claim 1 in which the method for forming the body region in the drain region of the DMOS device is a CMOS process.

15. A method as claimed in claim 1 in which the DMOS device is an LDMOS device.

* * * * *

UNITED STATES PATENT AND TRADEMARK OFFICE
CERTIFICATE OF CORRECTION

PATENT NO.    : 6,835,627 B1
DATED         : December 28, 2004
INVENTOR(S)   : Seamus Paul Whiston et al.

It is certified that error appears in the above-identified patent and that said Letters Patent is hereby corrected as shown below:

Column 1,
Line 16, should read -- devices as well as bipolar CMOS (BiCMOS) devices on the --
Line 34, should read -- be appropriately aligned with the gate of LDMOS device, --
Line 36, should read -- Tilt Implant in 0.6 $\mu$m BCD5 Process, Flash Memory --

Column 3,
Line 60, should read -- In one embodiment of the invention the DMOS device is --

Column 4,
Line 6, should read -- conventional CMOS or BiCMOS process, and thus, LDN- --
Line 61, should read -- invention. An N-well 4 for the LDNMOS 1 and a P-well 5 --

Column 5,
Line 14, should read -- respectively, beneath the gates 14 by implanting appropriate --
Line 28, should read -- the dopant is directed into the N-well 4 in the direction of the --
Line 44, should read -- $\alpha$ by setting the tilt angle of implant at a first tilt angle $\theta$ of --
Line 46, should read -- at the second angle $\beta$ by setting the tilt angle of implant at --

Column 6,
Line 5, should read -- $\theta$ of 45° for determining the drain/source threshold voltage --
Line 7, should read -- implanted in the P-well 5 at the second angle $\beta$ of 83° using --
Line 47, should read -- be formed on the wafer either simultaneously or sequentially --
Line 49, should read -- LDMOS devices have been described as being formed using --
Line 55, should read -- P-body region has been described as being implanted before --
Line 56, should read -- N-body region, it will be appreciated that the P-body and --
Line 57, should read -- N-body regions may beformed in any order. --

Column 7,
Line 27, should read -- 7. A method as claimed in claim 6 in which the second --

UNITED STATES PATENT AND TRADEMARK OFFICE
CERTIFICATE OF CORRECTION

PATENT NO. : 6,835,627 B1
DATED : December 28, 2004
INVENTOR(S) : Seamus Paul Whiston et al..

It is certified that error appears in the above-identified patent and that said Letters Patent is hereby corrected as shown below:

Column 8,
Line 4, should read -- implanted in each of steps (a) and (b) may be the same or --

Signed and Sealed this

Seventh Day of June, 2005

JON W. DUDAS
*Director of the United States Patent and Trademark Office*